(12) United States Patent
Don

(10) Patent No.: US 12,008,300 B2
(45) Date of Patent: Jun. 11, 2024

(54) MACHINE LEARNING-BASED UNRAVEL ENGINE FOR INTEGRATED CIRCUIT PACKAGING DESIGN

(71) Applicant: Siemens Industry Software Inc., Plano, TX (US)

(72) Inventor: Dominic Don, Madison, AL (US)

(73) Assignee: Siemens Industry Software Inc., Plano, TX (US)

( * ) Notice: Subject to any disclaimer, the term of this patent is extended or adjusted under 35 U.S.C. 154(b) by 347 days.

(21) Appl. No.: 17/462,342

(22) Filed: Aug. 31, 2021

(65) Prior Publication Data

US 2023/0068852 A1 Mar. 2, 2023

(51) Int. Cl.
  *G06F 30/392* (2020.01)
  *G06F 30/394* (2020.01)
  *G06N 20/00* (2019.01)

(52) U.S. Cl.
  CPC .......... *G06F 30/392* (2020.01); *G06F 30/394* (2020.01); *G06N 20/00* (2019.01)

(58) Field of Classification Search
  CPC ...... G06F 30/392; G06F 30/394; G06F 30/27; G06N 20/00; G06N 3/09
  See application file for complete search history.

(56) References Cited

U.S. PATENT DOCUMENTS

| 5,153,843 | A * | 10/1992 | Batcher | G06F 30/394 |
| | | | | 716/124 |
| 7,299,444 | B1 * | 11/2007 | Tai | G06F 30/3947 |
| | | | | 716/122 |
| 8,464,196 | B1 * | 6/2013 | Lawson | G06F 30/394 |
| | | | | 716/129 |
| 8,910,105 | B1 * | 12/2014 | Lawson | G06F 30/394 |
| | | | | 716/139 |
| 9,202,001 | B1 * | 12/2015 | Lawson | G06F 30/398 |
| 9,348,963 | B1 * | 5/2016 | Lin | G06F 30/394 |
| 2006/0112366 | A1 * | 5/2006 | Wadland | G06F 30/394 |
| | | | | 716/139 |
| 2010/0094609 | A1 * | 4/2010 | Han | G06F 30/367 |
| | | | | 703/14 |
| 2012/0117529 | A1 * | 5/2012 | Nishio | G06F 30/394 |
| | | | | 716/137 |
| 2018/0068907 | A1 * | 3/2018 | Kim | G06F 30/394 |
| 2023/0153505 | A1 * | 5/2023 | Chang | G06F 30/27 |
| | | | | 716/100 |
| 2023/0157061 | A1 * | 5/2023 | Bilodeau | H10K 50/856 |
| | | | | 257/40 |
| 2023/0318598 | A1 * | 10/2023 | Englekirk | H03K 17/693 |
| | | | | 327/434 |

* cited by examiner

*Primary Examiner* — Nha T Nguyen

(57) ABSTRACT

This application discloses a computing system to identify net lines corresponding to connections between pins of a source layout design describing a first electronic device and pins of a target layout design describing a second electronic device, scan the net lines in an order selected based, at least in part, on an orientation of the net lines between pins of the source layout design and the pins of the target layout design, identify a plurality of the scanned net lines cross each other, and unravel the crossed net lines by swapping pin assignments of the crossed net lines. The computing system can implement a machine learning algorithm having a first stage to determine a scan order for the net lines and having a second stage to identify the net lines that cross each other and unravel the crossed net lines.

14 Claims, 6 Drawing Sheets

MACHINE LEARNING-BASED UNRAVEL ENGINE FOR INTEGRATED CIRCUIT PACKAGING DESIGN

TECHNICAL FIELD

This application is generally related to electronic design automation and, more specifically, to machine learning-based unravel engine for integrated circuit packaging design.

BACKGROUND

In electronics manufacturing, integrated circuit packaging refers to encapsulating an integrated circuit formed on a semiconductor die into a package device, such as a case, housing, or the like. The package device can help protect the semiconductor die from its environment, for example, from physical damage, corrosion, or the like. The package device also can include an interconnect to electrically connect interface pins of the semiconductor die to leads or solder bumps of the package device.

As complexity of integrated circuits grows, so too has the complexity of package devices. For example, some package devices may be designed to accommodate multiple semiconductor dies, each including thousands of pads, pins, or solder bumps to be supported by the interconnect in the package device. These package devices can include many stacked layers with traces to route connections on a layer and vias to provide inter-layer electrical connectivity.

As integrated circuit packaging design technologies have improved to allow more components or dies to be put together in a single package, more physical connections between two or more component pins or die pins, often represented by flight lines, can be allowed among them. Later in the design process, the physical connections can be realized according to the flight lines by routing metal traces between the pins in the package on different layers of a substrate. These flight lines may cross each other, which can prompt an increase in metal trace length or insertion of an electronical via between layers of a substrate to avoid the crossing, which can often consume design time and increase production costs of a package design.

SUMMARY

This application discloses a computing system to identify net lines corresponding to connections between pins of a source layout design describing a first electronic device and pins of a target layout design describing a second electronic device. In some embodiments, the computing system can perform an initial pin assignment to the net lines in the source layout design and the target layout design based, at least in part, on the orientation of the net lines in the source layout design and the target layout design. The computing system can scan the net lines in an order selected based, at least in part, on an orientation of the net lines between pins of the source layout design and the pins of the target layout design, identify a plurality of the scanned net lines cross each other, and unravel the crossed net lines by swapping pin assignments of the crossed net lines.

The computing system can implement a machine learning algorithm having a first stage to determine a scan order for the net lines and having a second stage to identify the net lines that cross each other and unravel the crossed net lines. The computing system can train the first stage of the machine learning algorithm with scan order training data. The computing system can generate the scan order training data by receiving an orientation of net lines between multiple training layout designs, iteratively selecting different scan orders for the net lines of the multiple training layout designs, performing an unravel process on the net lines between the multiple training layout designs, and generating scan order training data based on orientation of the net lines, the selected scan orders, and the performance of the unravel process on the net lines.

The computing system can train the second stage of the machine learning algorithm with net line crossing training data. The computing system can generate the net line crossing training data by gathering net line data including pin configurations for multiple circuit components, computing cross-products for sets of net lines based on the pin configurations to identify which of the sets of the net lines are crossed, performing an unravel process on the crossed sets of the net lines by swapping pin assignments for the net lines in the pin configurations, and generating net line crossing training data that includes the cross-products for the sets of the net lines and the performance of the unravel process on the net lines. Embodiments will be described below in greater detail.

DETAILED DESCRIPTION

Illustrative Operating Environment

Figure 1:
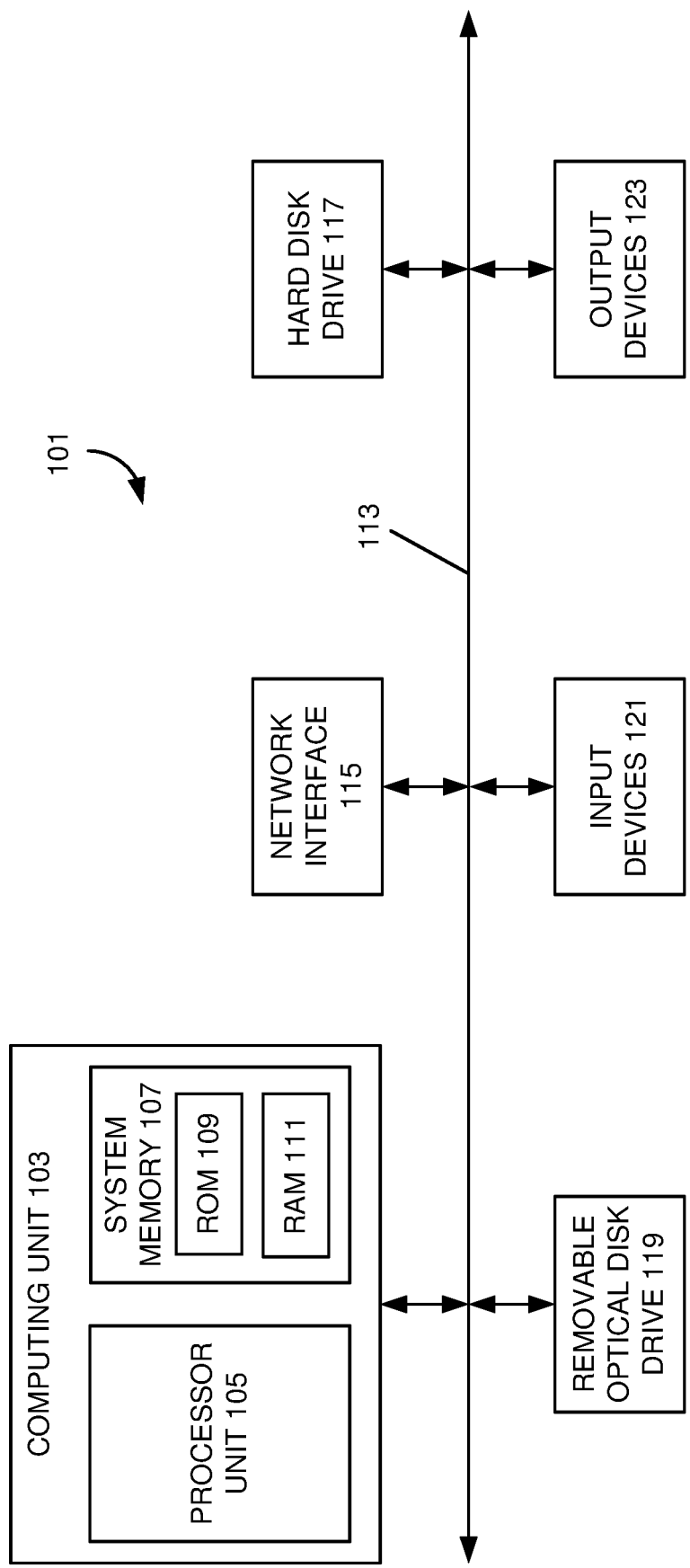
FIGS. 1 and 2 illustrate an example of a computer system of the type that may be used to implement various embodiments of the invention.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 115-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
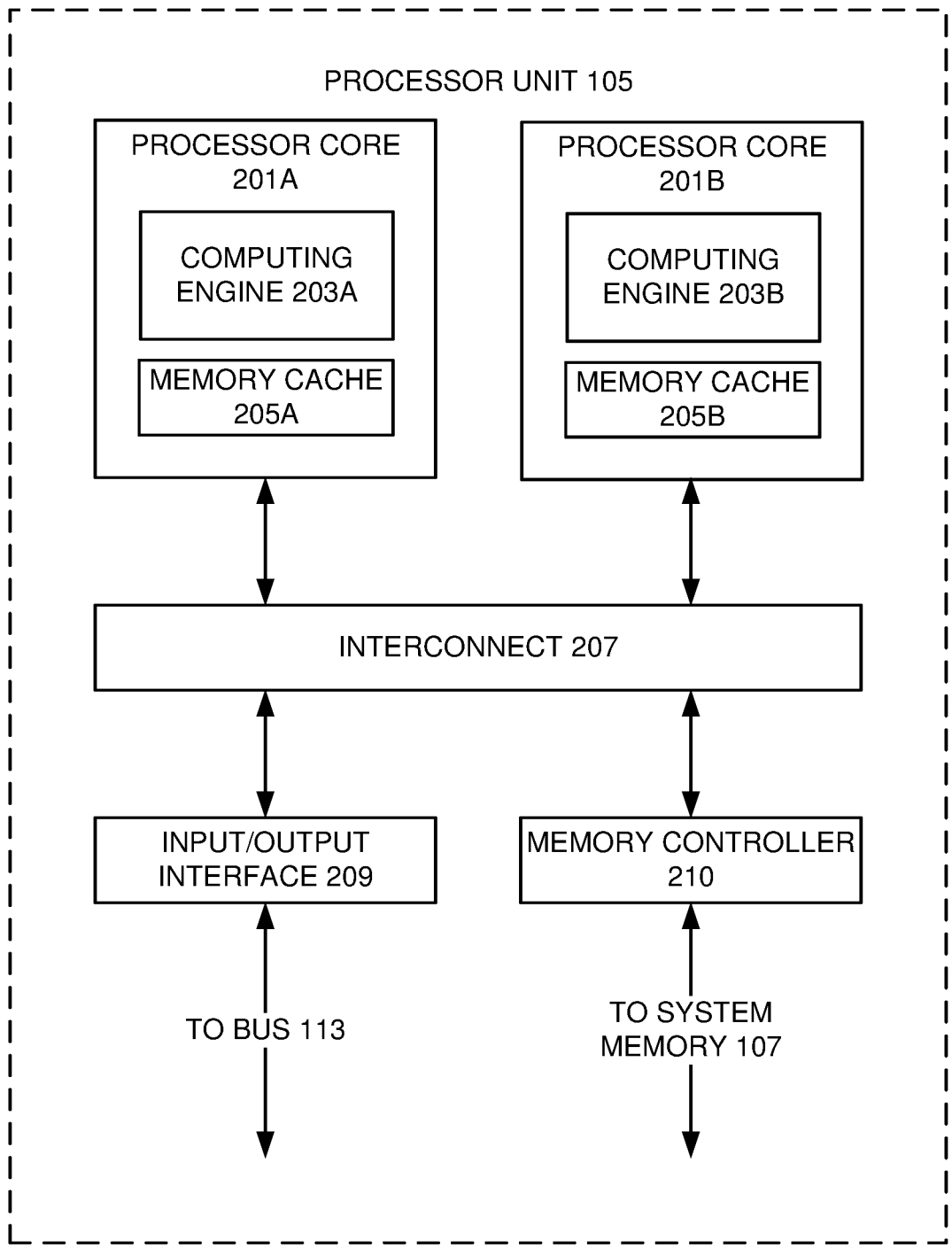

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, California, the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Machine Learning-Based Unravel Engine for Integrated Circuit Packaging Design

Figure 3:
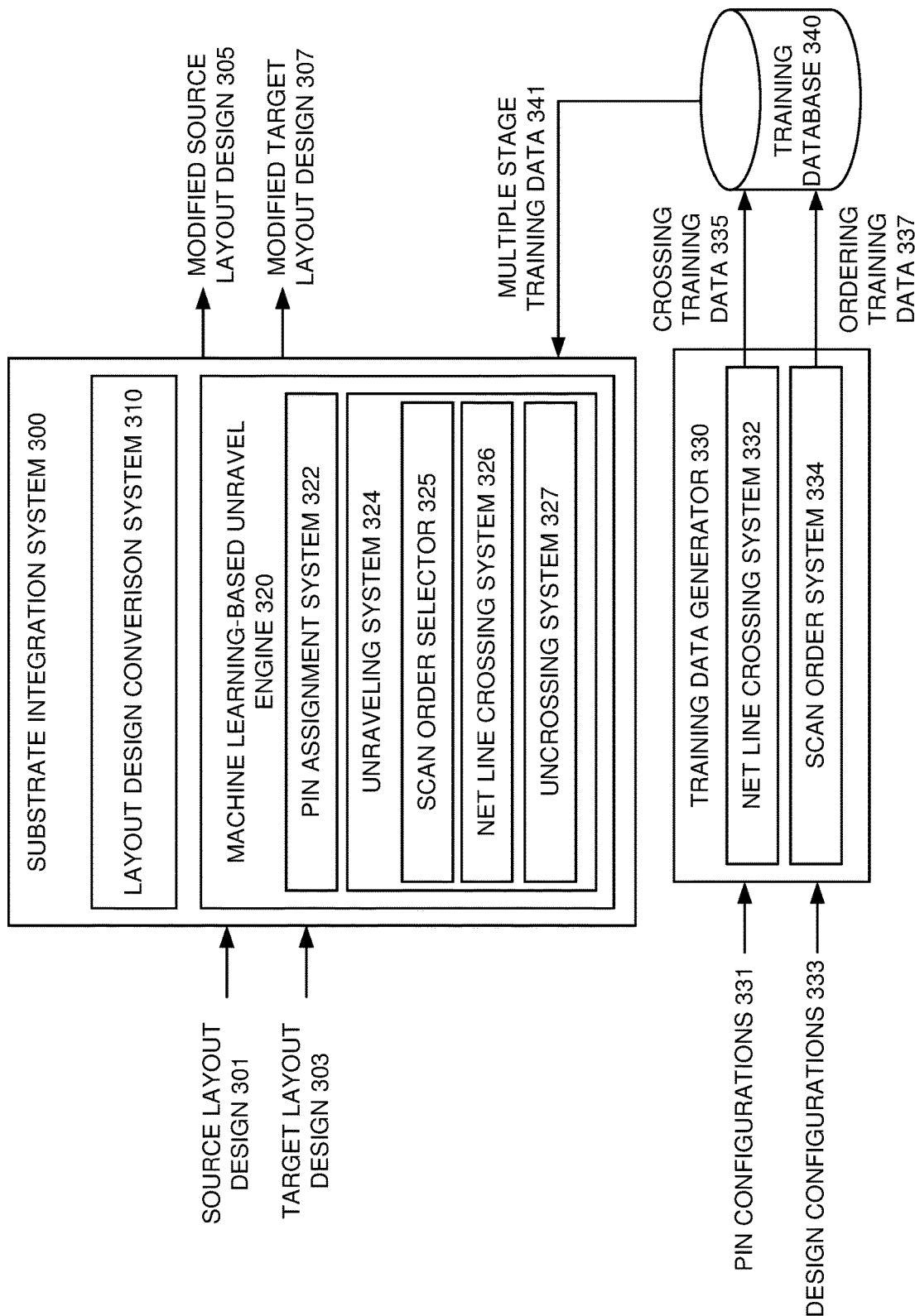
FIG. 3 illustrates an example of a substrate integration system including a machine learning-based unravel engine for integrated circuit packaging design according to various embodiments.
Figure 4:
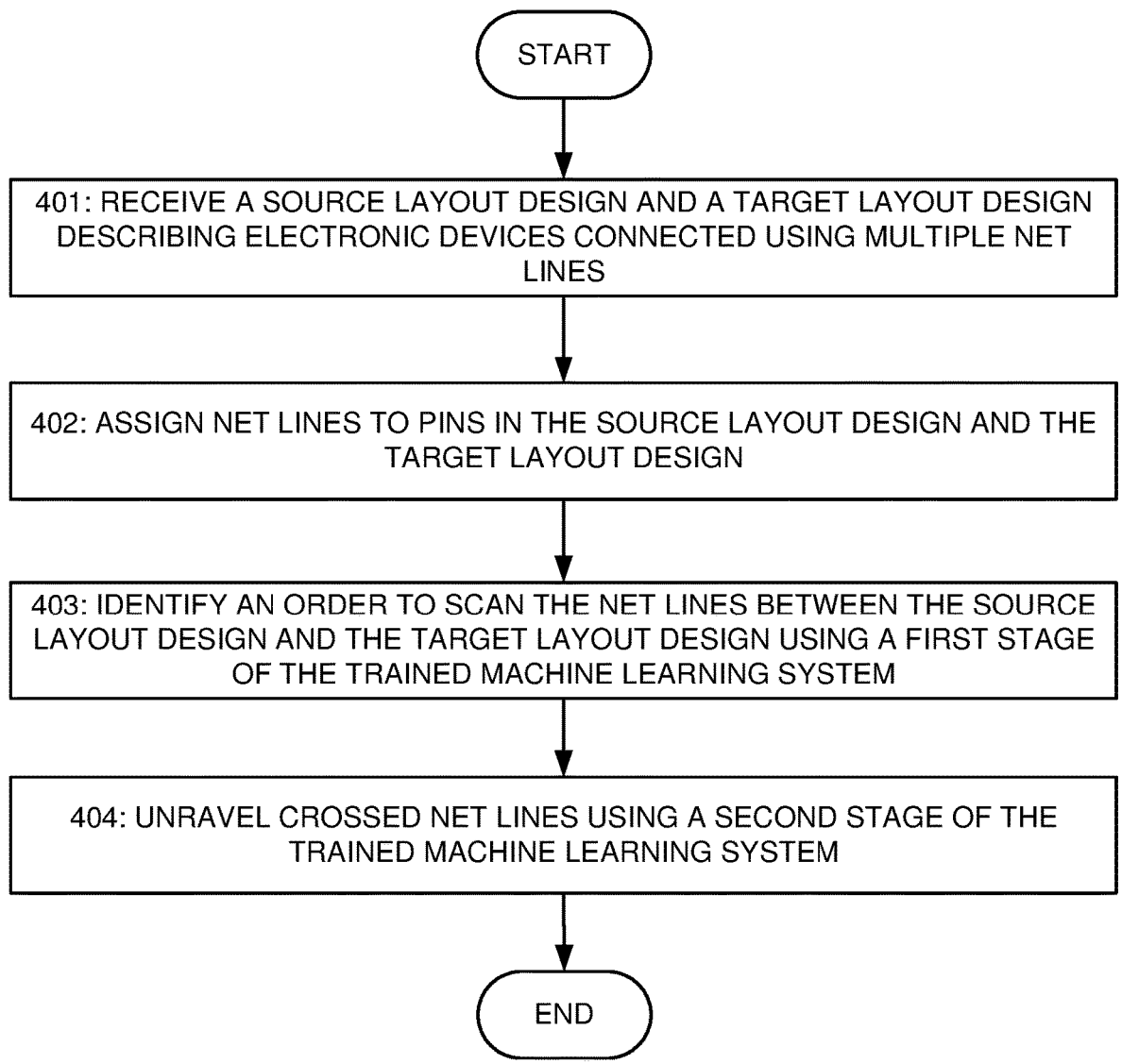
FIG. 4 illustrates an example flowchart for performing net line unraveling utilizing a multi-stage machine learning-based unravel engine according to various examples.

FIG. 3 illustrates an example of a substrate integration system 300 including a machine learning-based unravel engine 320 for integrated circuit packaging design according to various embodiments. FIG. 4 illustrates an example flowchart for performing net line unraveling utilizing a multi-stage machine learning-based unravel engine according to various examples. Referring to FIGS. 3 and 4, the substrate integration system 300, in a block 401 of FIG. 4, can receive a source layout design 301 and a target layout design 302 describing electronic devices connected using multiple net lines. The source layout design 301 and the target layout design 302, in some embodiments, can describe physical layouts of a semiconductor die and an electronic package device configured to support one or more semiconductor dies for installation into an electronic system. In some embodiments, the package device can encapsulate the semiconductor dies, for example, protecting the semiconductor dies from physical damage, corrosion, or other environmental conditions in the electronic system. In some embodiments, the source layout design 301 and the target layout design 302 can correspond to different electronic devices, such as package devices, placed as components on a printed circuit board layout design. The source layout design 301 and the target layout design 302 can be specified in an Open Database format, such as ODB++, a model the electronic device at a register transfer level (RTL) of abstraction, for example, with code in a hardware description language (HDL), such as System Verilog, Very high speed integrated circuit Hardware Design Language (VHDL), System C, or the like.

The substrate integration system 300 can include a layout design conversion system 310 to convert the source layout design 301 and the target layout design 302 to an internal format compatible with the substrate integration system 300, which can be specified in ASCII. The layout design conversion system 310 can parse the source layout design 301 and the target layout design 302 to identify pins associated with their electronic devices, a location of the pins on a two-dimensional floorplan, sizes of the electronic devices, signals between the electronic devices, layers or a stack-up of a printed circuit board associated with the electronic devices, or the like, which can be included in the internal format of the source layout design 301 and the target layout design 302.

The substrate integration system 300 can include a machine learning-based unravel engine 320 to identify net lines corresponding to signal connections between the source layout design 301 and the target layout design 302, analyze the net lines to determine when the sets of net lines cross each other, and modify the source layout design 301 and the target layout design 302 to set new pin assignments that unravel one or more the crossed net lines. In some embodiments, the machine learning-based unravel engine 320 can include one or more trained machine learning algorithms, such as an artificial neural network, or the like, configured to receive the source layout design 301 and the target layout design 302 and output a modified source layout design 305 and/or a modified target layout design 307, which includes one or more unraveling of net lines. The modified source layout design 305 and/or the modified target layout design 307 can be utilized by a downstream electronic design automation tool, such as a printed circuit board layout tool, to determines routes for metal traces that would physically implement the net lines between the pins assignments in the modified source layout design 305 and/or a modified target layout design 307.

The machine learning-based unravel engine 320 can include a pin assignment system 322 that, in a block 402 of FIG. 4, can assign net lines to pins in the source circuit design 301 and the target circuit design 302. In some embodiments, the pin assignment system 322 can identify the signals to be connected between the source layout design 301 and the target layout design 302, the pins in each of the source layout design 301 and the target layout design 302 available for assignment, and ascertain configurations of the source layout design 301 and the target layout design 302 relative to each other, for example, determine which sides of the source layout design 301 and the target layout design 302 reside closest to each other. The pin assignment system 322 can assign pins to the net lines in the source layout design 301 and/or the target layout design 302 based on the configurations of the source layout design 301 and the target layout design 302.

The machine learning-based unravel engine 320 can include an unraveling system 324 to identify net lines between the source layout design 301 and the target layout design 302 that cross each other, to determine how to unravel the net lines, and then modify the source layout design 301 and the target layout design 302 with new pin assignments that unravel one or more of the crossed net lines. The unraveling system 324 can include a scan order system 325 that, in a block 403 of FIG. 4, can identify an order to scan the net lines between the source layout design and the target layout design using a first stage of the trained machine learning system. In some embodiments, the scan order system 325 can receive an orientation of the net lines between the source layout design 301 and the target layout design 302 and then utilize the proximities or densities of the net lines, locations of the net lines relative to the edges of the source layout design 301 and the target layout design 302, or the like, to determine a starting point to scan the net lines for unraveling operations and also determine a sequence or a scan order for the net lines. The scan order system 325 can be implemented in the first stage of the multiple stages of the machine learning algorithm implemented by the machine learning-based unravel engine 320.

The unraveling system 324 can include a net line crossing system 326 to identify whether any of the scanned net lines were crossed. In some embodiments, the net line crossing system 326 can utilize coordinates of the pins for the net lines in two-dimensional floorplans for the source layout design 301 and the target layout design 302 to determine whether the net lines cross each other. The unraveling system 324 can include an uncrossing system 327 that, in a block 404 of FIG. 4, can unravel crossed net lines. In some embodiments, the uncrossing system 327 can unravel the crossed net lines by swapping pin assignments for the crossed net lines. The net line crossing system 326 and the uncrossing system 327 can be implemented in a second stage of the machine learning algorithm implemented by the machine learning-based unravel engine 320.

The substrate integration system 300 can include a training data generator 330 to generate multiple types of training data, such as crossing training data 335 and ordering training data 337, which the substrate integration system 300 can utilize to train the multiple stages of the machine learning-based unravel engine 320. The training data generator 330 can include a net line crossing system 332 to receive pin configurations 331 for various net lines. The pin configurations 331, in some embodiments, can correspond to relative coordinates for pins assigned to the net lines, for example, associated with location on a two-dimensional floorplan. The net line crossing system 332 can utilize the pin configurations 331 to identify whether net lines were crossed, for example, by generating a cross-product of locations of the pins assigned to the net lines. The net line crossing system 332 can unravel the crossed net lines by swapping pin assignments for the net lines. The net line crossing system 332 can generate the crossing training data 335 as a combination of the cross-product and the crossing status after unraveling. Embodiments of generating crossing training data will be described below in greater detail with reference to FIG. 5.

Figure 5:
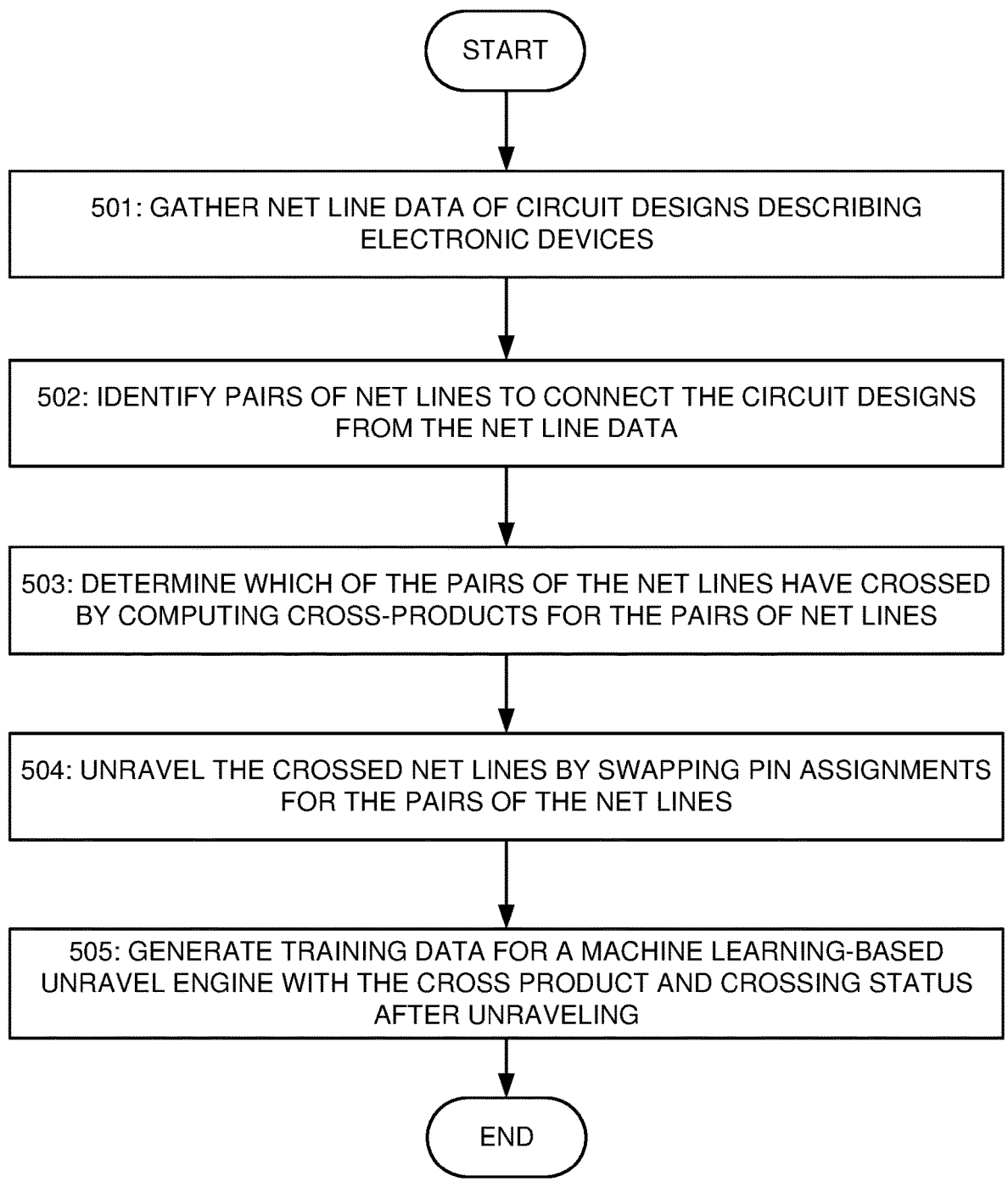
FIG. 5 illustrates an example flowchart for generating training data for a first stage of the multi-stage machine learning-based unravel engine according to various examples.

FIG. 5 illustrates an example flowchart for generating training data for a first stage of the multi-stage machine learning-based unravel engine according to various examples. Referring to FIG. 5, in a block 501, a computing system implementing a training data generator can gather net line data of circuit designs describing electronic devices. In some embodiments, the training data generator can receive pin configurations for the net lines, which can describe locations of pins assigned to the net lines connecting the circuit components. The training data generator, in some embodiments, can derive the x-y coordinates for the pins assigned to the net lines.

In a block 502, the computing system implementing the training data generator can identify pairs of net lines to connect the circuit designs from the net line data, and, in a block 503, the computing system implementing the training data generator can determine which of the pairs of the net lines have crossed by computing cross-products for the pairs of net lines. The training data generator can calculate the cross-products for the pairs of the net lines based on the coordinates of the assigned pins for the net lines in the pairs. The result of the cross-product calculation can indicate whether the pairs of the net lines cross each other.

In a block 504, the computing system implementing the training data generator can unravel the crossed net lines by swapping pin assignments for the pairs of the net lines. In some embodiments, the training data generator can re-perform the cross product calculation on the pairs of the net lines after the swapping of pins to confirm the swapping of the pin assignments uncrossed the net lines.

In a block 505, the computing system implementing the training data generator can generate training data for a machine learning-based unravel engine with the cross product and crossing status after unraveling. The training data, in some embodiments, can identify pin assignments for pairs of net lines that were deemed crossed or not based on the cross-product calculations and a corresponding results associated with unraveling those net line pairs that were deemed to be crossed.

Referring back to FIG. 3, the training data generator 330 can include a scan order system 334 to receive design configurations 333 for multiple electronic devices connected via net lines. The design configurations 333, in some embodiments, can correspond to relative coordinates for pins assigned to the net lines connecting the electronic devices, for example, associated with locations on a two-dimensional floorplan. The scan order system 334 can iteratively select different orders for the net lines to be unraveled, for example, analyzed to determine whether net line crossing exist and then unraveled. The scan order system 334 can determine a number of crossed net lines that remain after the net lines were scanned with each of the different orders, and generate the ordering training data 337 to describe the design configuration 333, the scan order, the unravel process, and the results of the unraveling. Embodiments of generating the ordering training data will be described below in greater detail with reference to FIG. 6.

Figure 6:
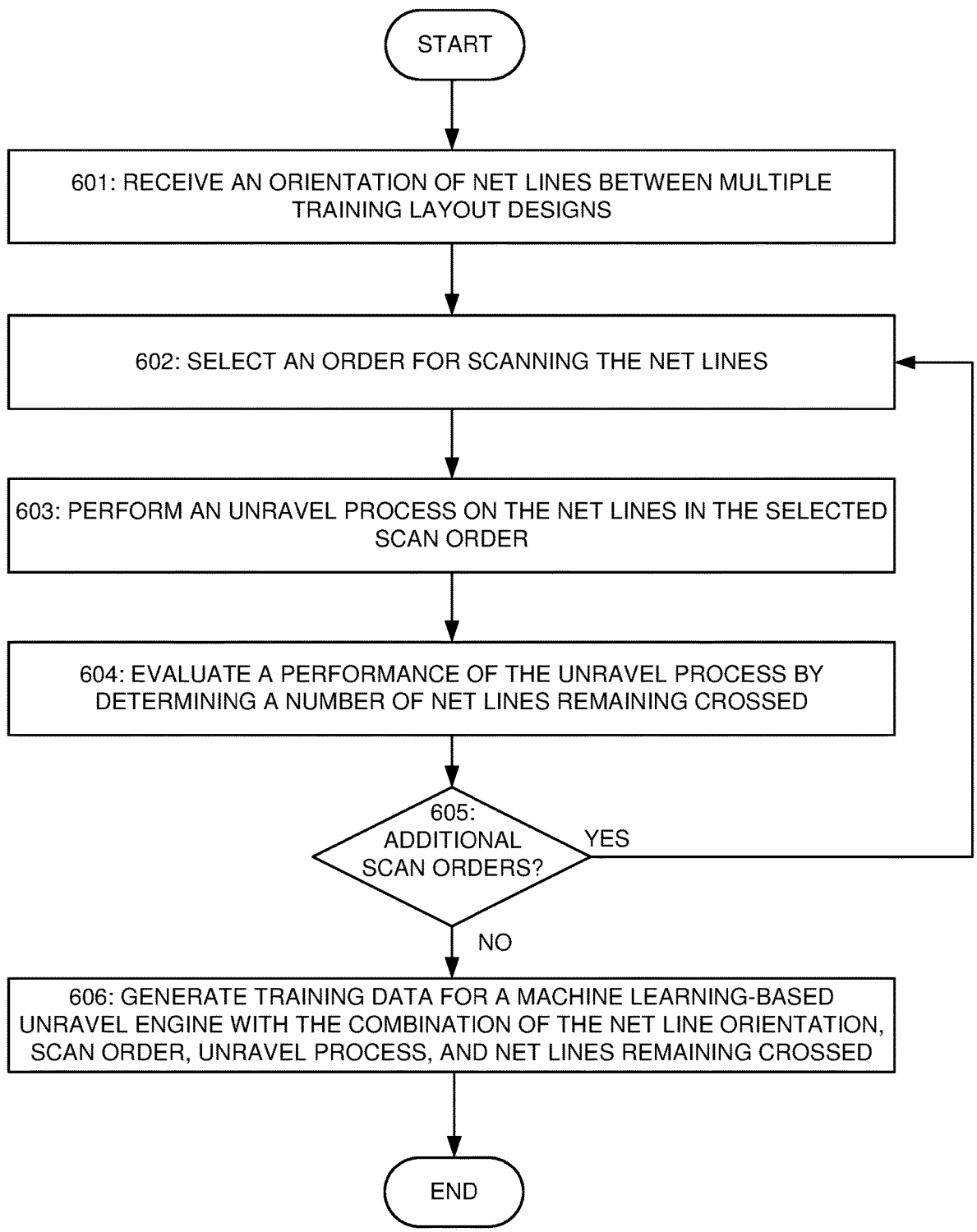
FIG. 6 illustrates an example flowchart for generating training data for a second stage of the multi-stage machine learning-based unravel engine according to various examples.

FIG. 6 illustrates an example flowchart for generating training data for a second stage of the multi-stage machine learning-based unravel engine according to various examples. Referring to FIG. 6, in a block 601, a computing system implementing a training data generator can receive an orientation of net lines between multiple training layout designs. In some embodiments, the orientation of the net lines can describe the proximities of the net lines relative to each other, for example, based on their pin assignments. The orientation of the net lines also can describe a relative density of the net lines associated with different sides of the training layout designs.

In a block 602, the computing system implementing the training data generator can select an order for scanning the net lines. In some embodiments, the training data generator can select a starting point for scanning the net lines to correspond to an edge of the group of net lines and then select the order to traverse the net lines towards the opposite edge. For example, when the net lines cross around an upper-left corner of a layout design, the training data generator can select the bottom-most net lines on the left edge of the upper-left corner as the starting point and a scan order that proceeds up the left edge and around to the top-edge of the upper-left corner. In some examples, the training data generator can select the right-most net lines on the upper edge of the upper-left corner as the starting point and a scan order that proceeds left across the upper edge and around to the left-edge of the upper-left corner. The training data generator can select the starting net line(s) in the middle of the net lines and set a scan order the proceeds away from the selected starting net line(s).

In a block 603, the computing system implementing the training data generator can perform an unravel process on the net lines in the selected scan order. The training data generator can scan a pair of the net lines based on the selected scan order, determine whether the net lines were crossed, for example, by calculating the cross-product for the pair of net lines, and when the pair of net lines was deemed to be crossed, attempt to uncross the net lines. The unravel process can continue scanning the net lines in the selected scan order, identifying crossed net lines, and attempting to unravel them.

In a block 604, the computing system implementing the training data generator can evaluate a performance of the unravel process by determining a number of net lines remaining crossed. Since the starting point and the scan order of unravel process can provide differing results, for example, differing pin assignments for the net lines and differing number of net lines remaining crossed, the training data generator can record the number of the net lines remaining crossed for the selected scan order.

In a block 605, the computing system implementing the training data generator can determine whether additional scan orders can be selected. When, in the block 605, at least one additional scan orders can be selected, execution can return to the block 602, where the computing system implementing the training data generator can select an order for scanning the net lines.

When, in the block 605, no additional scan orders can be selected, execution can proceed to a block 606, where the computing system implementing the training data generator can generate training data for a machine learning-based unravel engine with the combination of the net line orientation, scan order, unravel process, and net lines remaining crossed. The training data generator can generate a different set of the training data for each or the different possible starting points and scan orders for the orientation of the net lines that can inform the machine learning algorithm of the relative success of each different scan order by labeling the training data with the number of crossed net lines remaining after the unraveling process. The training data generator also can repeat the blocks 601-606 for multiple different orientations of the net lines.

Referring back to FIG. 3, the training data generator 330 can store the crossing training data 335 and the ordering training data 337 to a training database 340, which can be accessible by the substrate integration system 300 for use in training the machine learning algorithm implemented in the machine learning-based unravel engine 320. The substrate integration system 300, in some embodiments, retrieve the crossing training data 335 and the ordering training data 337 from the training database 340 as multiple stage training data 341 and then train the multiple stages of the machine learning algorithm with the multiple stage training data 341. While FIG. 3 shows the training data generator 330 storing the crossing training data 335 and the ordering training data 337 to the training database 340 for subsequent use by the substrate integration system 300, in some embodiments, the training data generator 330 can provide the crossing training data 335 and the ordering training data 337 directly to the substrate integration system 300 for use in training the machine learning algorithm implemented in the machine learning-based unravel engine 320.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
identifying, by a computing system, net lines corresponding to connections between pins of a source layout design describing a first electronic device and pins of a target layout design describing a second electronic device;
determining, by the computing system implementing a first stage of a machine learning algorithm, a scan order for the net lines based, at least in part, on an orientation of the net lines between pins of the source layout design and the pins of the target layout design, wherein the first stage of the machine learning algorithm is configured with scan order training data generated by receiving an orientation of net lines between multiple training layout designs, iteratively selecting different scan orders for the net lines of the multiple training layout designs, and performing an unravel process on the net lines between the multiple training layout designs, and wherein the scan order training data is generated from the orientation of the net lines, the selected scan orders, and the performance of the unravel process on the net lines;
scanning, by the computing system, the net lines in the scan order for the net lines;
identifying, by the computing system implementing a second stage of the machine learning algorithm, a plurality of the scanned net lines cross each other; and
unraveling, by the computing system implementing the second stage of the machine learning algorithm, the crossed net lines by swapping pin assignments of the crossed net lines.

2. The method of claim 1, further comprising performing, by the computing system, an initial pin assignment to the net lines in the source layout design and the target layout design based, at least in part, on the orientation of the net lines in the source layout design and the target layout design.

3. The method of claim 1, further comprising utilizing, by the computing system, the scan order training data to train the first stage of the machine learning algorithm.

4. The method of claim 1, further comprising:
gathering, by the computing system, net line data including pin configurations for multiple circuit components;
computing, by the computing system, cross-products for sets of net lines based on the pin configurations to identify which of the sets of the net lines are crossed;
performing, by the computing system, an unravel process on the crossed sets of the net lines by swapping pin assignments for the net lines in the pin configurations; and
generating, by the computing system, net line crossing training data that includes the cross-products for the sets of the net lines and the performance of the unravel process on the net lines.

5. The method of claim 4, further comprising utilizing, by the computing system, the net line crossing training data to train the second stage of the machine learning algorithm.

6. A system comprising:
a memory device configured to store machine-readable instructions; and
a computing system including one or more processing devices, in response to executing the machine-readable instructions, configured to:
   identify net lines corresponding to connections between pins of a source layout design describing a first electronic device and pins of a target layout design describing a second electronic device;
   scan the net lines in an order selected, using a first stage of a machine learning algorithm, based, at least in part, on an orientation of the net lines between pins of the source layout design and the pins of the target layout design; and
   implement a second stage of the machine learning algorithm to identify a plurality of the scanned net lines cross each other, and unravel the crossed net lines by swapping pin assignments of the crossed net lines, wherein the second stage of the machine learning algorithm is configured with net line crossing training data generated by gathering net line data including pin configurations for multiple circuit components, computing cross-products for sets of net lines based on the pin configurations to identify which of the sets of the net lines are crossed, and performing an unravel process on the crossed sets of the net lines by swapping pin assignments for the net lines in the pin configurations, and wherein the generated net line crossing training data includes the cross-products for the sets of the net lines and the performance of the unravel process on the net lines.

7. The system of claim 6, wherein the one or more processing devices, in response to executing the machine-readable instructions, are configured to:
   receive an orientation of net lines between multiple training layout designs;
   iteratively select different scan orders for the net lines of the multiple training layout designs;
   perform an unravel process on the net lines between the multiple training layout designs; and
   generate scan order training data based on orientation of the net lines, the selected scan orders, and the performance of the unravel process on the net lines.

8. The system of claim 7, wherein the one or more processing devices, in response to executing the machine-readable instructions, are configured to utilize the scan order training data to train the first stage of the machine learning algorithm.

9. The system of claim 6, wherein the one or more processing devices, in response to executing the machine-readable instructions, are configured to utilize the net line crossing training data to train the second stage of the machine learning algorithm.

10. An apparatus including a memory device storing instructions configured to cause one or more processing devices to perform operations comprising:
   identifying net lines corresponding to connections between pins of a source layout design describing a first electronic device and pins of a target layout design describing a second electronic device;
   implement a first stage of a machine learning algorithm to determine a scan order for the net lines based, at least in part, on an orientation of the net lines between pins of the source layout design and the pins of the target layout design, wherein the first stage of the machine learning algorithm is configured with scan order training data generated by receiving an orientation of net lines between multiple training layout designs, iteratively selecting different scan orders for the net lines of the multiple training layout designs, and performing an unravel process on the net lines between the multiple training layout designs, and wherein the scan order training data is generated from the orientation of the net lines, the selected scan orders, and the performance of the unravel process on the net lines;
   scanning the net lines in the scan order for the net lines; and
   implement a second stage of the machine learning algorithm to identify a plurality of the scanned net lines cross each other, and unravel the crossed net lines by swapping pin assignments of the crossed net lines.

11. The apparatus of claim 10, wherein the instructions are configured to cause one or more processing devices to perform operations further comprising performing an initial pin assignment to the net lines in the source layout design and the target layout design based, at least in part, on the orientation of the net lines in the source layout design and the target layout design.

12. The apparatus of claim 10, wherein the instructions are configured to cause one or more processing devices to perform operations further comprising utilizing the scan order training data to train the first stage of the machine learning algorithm.

13. The apparatus of claim 10, wherein the instructions are configured to cause one or more processing devices to perform operations further comprising:
   gathering net line data including pin configurations for multiple circuit components;
   computing cross-products for sets of net lines based on the pin configurations to identify which of the sets of the net lines are crossed;
   performing an unravel process on the crossed sets of the net lines by swapping pin assignments for the net lines in the pin configurations; and
   generating net line crossing training data that includes the cross-products for the sets of the net lines and the performance of the unravel process on the net lines.

14. The apparatus of claim 13, wherein the instructions are configured to cause one or more processing devices to perform operations further comprising utilizing the net line crossing training data to train the second stage of the machine learning algorithm.

* * * * *